United States Patent
Lukes et al.

(10) Patent No.: US 9,397,638 B2
(45) Date of Patent: Jul. 19, 2016

(54) IMPLEMENTING ADAPTIVE CONTROL FOR OPTIMIZATION OF PULSED RESONANT DRIVERS

(71) Applicant: International Business Machines Corporation, Armonk, NY (US)

(72) Inventors: Eric J. Lukes, Stewartville, MN (US); Patrick L. Rosno, Rochester, MN (US); Timothy J. Schmerbeck, Mantorville, MN (US); Dereje G. Yilma, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/696,300

(22) Filed: Apr. 24, 2015

(65) Prior Publication Data

US 2016/0182018 A1 Jun. 23, 2016

Related U.S. Application Data (63) Continuation of application No. 14/576,517, filed on Dec. 19, 2014.

(51) Int. Cl.
*H03K 3/00* (2006.01)
*H03K 3/012* (2006.01)

(52) U.S. Cl.
CPC ..................................... *H03K 3/012* (2013.01)

(58) Field of Classification Search
None
See application file for complete search history.

(56) References Cited

U.S. PATENT DOCUMENTS

| | | | | |
|---|---|---|---|---|
| 5,825,239 A | * | 10/1998 | Adal | H03G 3/30 327/331 |
| 6,693,450 B1 | | 2/2004 | Volk et al. | |
| 7,142,069 B2 | * | 11/2006 | Costa | H03L 5/00 331/111 |
| 7,277,331 B2 | | 10/2007 | Kim | |
| 7,298,200 B2 | | 11/2007 | Won | |
| 7,545,190 B2 | | 6/2009 | Chiang et al. | |
| 7,843,256 B2 | * | 11/2010 | Do | G05F 1/465 327/540 |
| 8,068,559 B1 | * | 11/2011 | Butcher | H04L 7/0087 375/316 |
| 8,588,340 B2 | * | 11/2013 | Tomita | H04L 25/03057 375/229 |
| 8,593,183 B2 | | 11/2013 | Papaefthymiou et al. | |
| 9,250,714 B2 | * | 2/2016 | Hiromi | G06F 3/0304 |
| 2007/0057699 A1 | * | 3/2007 | Tumer | G01T 1/17 327/70 |
| 2010/0164579 A1 | * | 7/2010 | Acatrinei | H02M 1/4208 327/172 |
| 2013/0272547 A1 | * | 10/2013 | Waller, Jr. | H03F 1/0233 381/120 |
| 2014/0028407 A1 | | 1/2014 | Chern et al. | |
| 2015/0061750 A1 | * | 3/2015 | Kandah | H03K 17/0822 327/419 |
| 2016/0084894 A1 | * | 3/2016 | Govindaraj | G01R 25/00 307/104 |

OTHER PUBLICATIONS

Appendix P—List of IBM Patents or Patent Applications Treated As Related—May 3, 2015.

* cited by examiner

*Primary Examiner* — Lincoln Donovan
*Assistant Examiner* — Khareem E Almo
(74) *Attorney, Agent, or Firm* — Joan Pennington (57) ABSTRACT

A method and circuit are provided for implementing adaptive control for optimization of pulsed resonant drivers, and a design structure on which the subject circuit resides. Peak detectors are used to detect a positive or up level reached by a resonant clock and negative or down level reached by the resonant clock. Each detected levels is compared to a reference level to determine when to vary the turn off timing of a clock driver pull-up device and/or a clock driver pull-down device. A positive peak detector controls the turn off time of the pull-up device and a negative peak detector controls a turn off time of the pull-down device in the pulsed resonant driver.

5 Claims, 6 Drawing Sheets

IMPLEMENTING ADAPTIVE CONTROL FOR OPTIMIZATION OF PULSED RESONANT DRIVERS

This application is a continuation application of Ser. No. 14/576,517 filed Dec. 19, 2014.

FIELD OF THE INVENTION

The present invention relates generally to the data processing field, and more particularly, relates to a method and circuit for implementing adaptive control for optimization of pulsed resonant drivers, and a design structure on which the subject circuit resides.

DESCRIPTION OF THE RELATED ART

To reduce power in digital clock drivers, an inductor capacitor (LC) circuit is designed to resonate at or near the desired clock frequency. The capacitance C of the resonant circuit is usually dominated by wiring and circuit capacitive loads of the circuits being clocked and the inductance L of the resonant circuit is usually dominated by an added inductor designed to produce the correct resonant frequency with the load capacitance C.

The clock driver starts the clock edge transition on each clock half cycle and then the LC circuit natural resonant behavior helps to drive the load and reduces the power required to be provided by the clock driver for the rest of the cycle. The clock driver starting edge transitions each half cycle, are required to provide energy to the LC resonant circuit to make up for resistive losses, and to guarantee the clock starting time and phase.

To reduce the clock driver power further, the clock driver pull-up device is turned off after some period of time so that it does not have to provide excess current to the LC resonant circuit. Likewise the clock driver pull-down device is turned off after some period of time so that it does not have to provide excess current to the LC resonant circuit.

The optimum time to turn off the pull-up or pull-down device to ensure power savings, and/or full power supply swing of the resonant signal, and/or optimum resonant signal duty cycle distortion will vary with semiconductor device process variations, temperature variations, power supply variations, and circuit asymmetries. Note that this optimum turn off time will be different for the pull-up device and the pull-down device. It is not possible to optimize the clock driver circuit with a fixed pull-up device or pull-down device turn-off time.

A need exists for a method and circuit to adaptively control, independently, the pull-up device and pull-down device turn off time period to optimize the pulsed, resonant clock driver.

SUMMARY OF THE INVENTION

Principal aspects of the present invention are to provide a method and circuit for implementing adaptive control for optimization of pulsed resonant drivers, and a design structure on which the subject circuit resides. Other important aspects of the present invention are to provide such method, circuit and design structure substantially without negative effects and that overcome many of the disadvantages of prior art arrangements.

In brief, a method and circuit are provided for implementing adaptive control for optimization of pulsed resonant drivers, and a design structure on which the subject circuit resides. Peak detectors are used to detect a positive or up level reached by a resonant clock and negative or down level reached by the resonant clock. Each detected levels is compared to a reference level to determine when to vary the turn off timing of a clock driver pull-up device and/or a clock driver pull-down device. A positive peak detector controls the turn off time of the pull-up device and a negative peak detector controls a turn off time of the pull-down device in the pulsed resonant driver.

In accordance with features of the invention, in a single ended clock drive arrangement a positive peak detector controls the turn off of the pull-up device and a negative peak detector controls the turn off of the pull-down device. By changing the positive peak detector reference levels with a variable source, such as a voltage digital-to-analog converter (DAC), the resonant clock positive swing can be controlled to be below, at or above a positive voltage rail by a programmable amount. The swing above the rail is caused by low LC circuit resistive damping which results in overshoot of the LC resonant signal. This overshoot can improve signal transition times and noise margins but must usually be limited to prevent circuit over-voltage. The features of this invention allow for this limiting.

In accordance with features of the invention, by changing the negative peak detector reference levels with a variable source, for example a voltage DAC, likewise the resonant clock negative swing can be controlled to be below, at or above the negative voltage rail or ground by a programmable amount. The swing below the rail is caused by low LC circuit resistive damping which results in undershoot of the LC resonant signal. This undershoot can improve signal transition times and noise margins but must usually be limited to prevent circuit over-voltage. The features of this invention allow for this limiting.

In accordance with features of the invention, at each process, temperature, voltage, and load condition, the adaptive loop maintains the desired signal positive and negative levels.

In accordance with features of the invention, for a differential clock the peak detectors optionally monitor the differential positive and negative peaks and/or each single ended positive or negative peaks.

In accordance with features of the invention, the lowest power dissipation is obtained with a minimum resonant clock signal swing; the fastest rise times with the biggest swing, including overshoots and undershoots, subject to breakdown voltage limitations. The lowest duty cycle distortion is usually between minimum and maximum amplitude. Whatever the optimization choice for the circuit the adaptive feedback loop minimizes amplitude variations over process, voltage, temperature and load conditions.

BRIEF DESCRIPTION OF THE DRAWINGS

The present invention together with the above and other objects and advantages may best be understood from the following detailed description of the preferred embodiments of the invention illustrated in the drawings, wherein:

FIG. 2 depicts a single ended, inverting output clock topology but a non-inverting clock topology as well as a differential clock topology are also supported by this invention;

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and apparatus are provided for implementing adaptive control for optimization of pulsed resonant drivers in accordance with preferred embodiments.

Figure 1A:
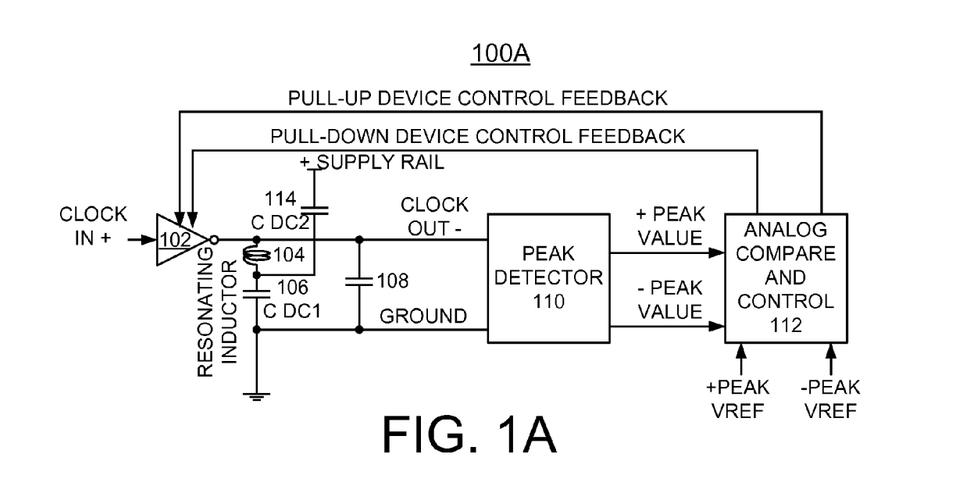
FIGS. 1A and 1B together provide a schematic and block diagram of an example inverting single ended adaptive pulsed resonant clock driver for implementing adaptive control for optimization of pulsed resonant drivers with an optional split DC blocking capacitor in accordance with preferred embodiments.
Figure 1B:
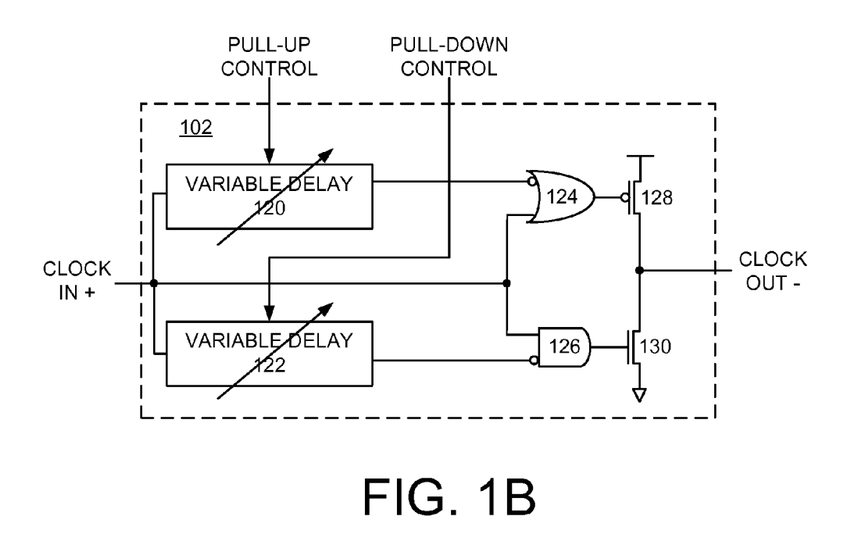

Having reference now to the drawings, in FIGS. 1A and 1B, there is shown an example inverting single ended adaptive pulsed resonant clock driver circuit generally designated by the reference character 100A for implementing adaptive control for optimization of pulsed resonant drivers in accordance with preferred embodiments.

Circuit 100A includes a clock input CLOCK IN+ applied to an inverting pulse driver 102 providing an inverted clock output CLOCK OUT−, and a resonating inductor 104 and a large DC blocking capacitor C DC1, 106 connected in series between the output of the inverting pulse driver 102 and a ground rail. The large DC blocking capacitor C DC1, 106 connected in series with the inductor 104 prevents the inductor from shorting the inverting pulse driver output to the lower power rail or ground at very low frequencies. An effective clock load capacitance 108 is composed of the circuit and wire loads. The resistive loss components (not shown) can be series resistance or parallel leakage resistance in almost any component. Common dominant loss components are series inductor R, wire series resistance, and capacitive load series resistance.

Circuit 100A includes a peak detector connected between ground and inverted clock output CLOCK OUT− providing a detected positive peak value+PEAK VALUE and a detected negative peak value−PEAK VALUE applied to an analog compare and control 112. The peak detector 110 produces an analog value corresponding to the resonant voltage waveform peak positive or high level amplitude and the peak negative or low level amplitude.

The analog compare and control 112 compares the detected positive peak value+PEAK VALUE with the positive peak reference value+PEAK VREF and compares the detected negative peak value−PEAK VALUE with the negative peak reference value−PEAK VREF, to determine whether to increase or decrease the associated variable delay in the Inverting pulse driver. The analog compare and control 112 generates and applies an identified pull-up device control feedback and a pull-down device control feedback applied to the inverting pulse driver 102 indicated at lines PULL-UP DEVICE CONTROL FEEDBACK, PULL-DOWN DEVICE CONTROL FEEDBACK.

Circuit 100A includes an optional additional DC blocking capacitor 114, C DC2 connected between the inductor 104 and capacitor 106, C DC1 common node to a positive or upper power rail+SUPPLY RAIL that is added to the otherwise single large DC blocking capacitor C DC1, 106 connected to ground or lower rail to mitigate low decoupling capacitor situations.

As shown in FIG. 1B, the inverting pulse driver 102 receives a clock input CLOCK IN+ applied to a variable delay 120 receiving a pull-up device control feedback signal and applied to a variable delay 122 receiving a pull-down device control feedback signal. The clock input CLOCK IN+ is applied to an input of a 2-input OR gate 124 with the output of the variable delay 120 applied to inverting input of the OR gate 124. The clock input CLOCK IN+ is applied to an input of a 2-input AND gate 126 with the output of the variable delay 122 applied to inverting input of the AND gate 126. The OR gate output drives the gate terminal of the pull-up P-channel field effect transistor (PFET) 128. The AND gate output drives the gate terminal of pull-down N-channel field effect transistor (NFET) 130.

In operation of circuit 100A, when the +peak value is below the +peak Vref level the pull-up control 112 increases the delay of the pull-up PFET delay which lengthens the PFET on time. Likewise, when the +peak value is above the +peak Vref level the pull-up control 112 decreases the delay of the pull-up PFET delay which shortens the PFET 128 on time. The adaptive loop of circuit 100A thereby settles on the +peak amplitude being as set by the +peak Vref voltage.

Similarly when the −peak value is above the −peak Vref level the pull-down control 112 increases the delay of the pull-down NFET delay which lengthens the NFET 130 on time. Likewise, when the −peak value is below the −peak Vref level the pull-down control 112 decrease the delay of the pull-down NFET delay which shortens the NFET 130 on time. The adaptive loop of circuit 100A thereby settles on the −peak amplitude being as set by the −peak Vref voltage.

Note that the peak detector 110 is typically implemented with averaging detectors that average the values of a detected peak over many cycles so that the control update loop is making only slow gradual updates so as not to create jitter. The pull-up and pull-down loops of circuit 100A can operate independently. Also the detected peak detector peak voltage sensed can be proportional to the actual peak voltage, for example ½ of peak voltage, so that voltages above the positive rail or below the negative rail or ground do not have to be produced. Likewise the +peak Vref and −peak Vref reference voltages advantageously are of the same proportion or fraction of the peak voltage for the same reason. For the loops to properly adapt and to minimize power in the delay blocks, the variable delay 120, 122 is usually limited to be between zero delay and ½ of a clock cycle of delay.

Figure 1C:
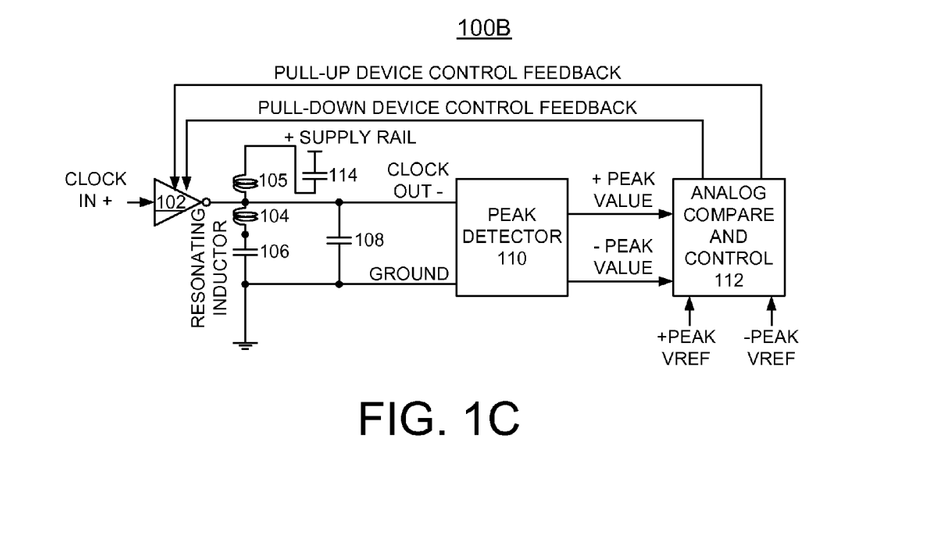
FIG. 1C is a schematic and block diagram of another example inverting single ended adaptive pulsed resonant clock driver with a symmetrical inductor connection to both ground and the power rail and a split DC blocking capacitor for implementing adaptive control for optimization of pulsed resonant drivers in accordance with preferred embodiments.

Referring also to FIG. 1C, there is shown another example inverting single ended adaptive pulsed resonant clock driver generally designated by the reference character 100B for implementing adaptive control for optimization of pulsed resonant drivers with a symmetrical inductor connection to both ground and the power rail and a split DC blocking capacitor in accordance with preferred embodiments. In circuit 100B, the same reference numbers are used for similar or identical components. Circuit 100B includes an additional symmetrical inductor 105 connected in series with the large DC blocking capacitor C DC2, 114 connected to the positive voltage rail together with the series connected inductor 104 and large DC blocking capacitor C DC1, 106 connected to ground.

Figure 2:
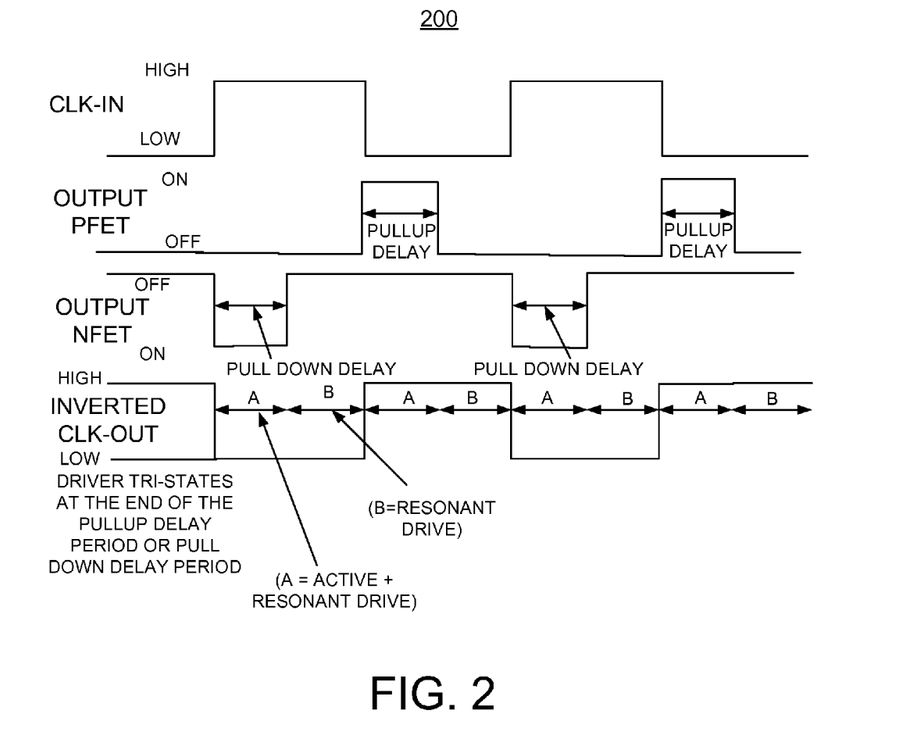
FIG. 2 is a diagram illustrating waveforms of the input clock (CLK-IN), the states of the output PFET pull-up device, output NFET pull-down device, and the inverted output clock for implementing adaptive control for optimization of pulsed resonant drivers in accordance with preferred embodiments.

Referring also to FIG. 2, there is shown a diagram illustrating waveforms generally designated by the reference character 200 of the input clock (CLK-IN), the states of the output PFET 128 and output NFET 130, and the inverted output clock CLOCK OUT− or INVERTED CLOCK OUT implementing adaptive control for optimization of pulsed resonant drivers in accordance with preferred embodiments. Note that at the end of the pullup delay period or pull-down delay period, that the driver tristates, meaning that both the PFET and NFET turn off until the clock starts to switch again. If this is an undesirable state, an additional pull-up or pull-down device can be used, driven from a clocking control signal, to make the clock output static low or high, as desired at the end of the pullup delay period or pull-down delay period.

Figure 3A:
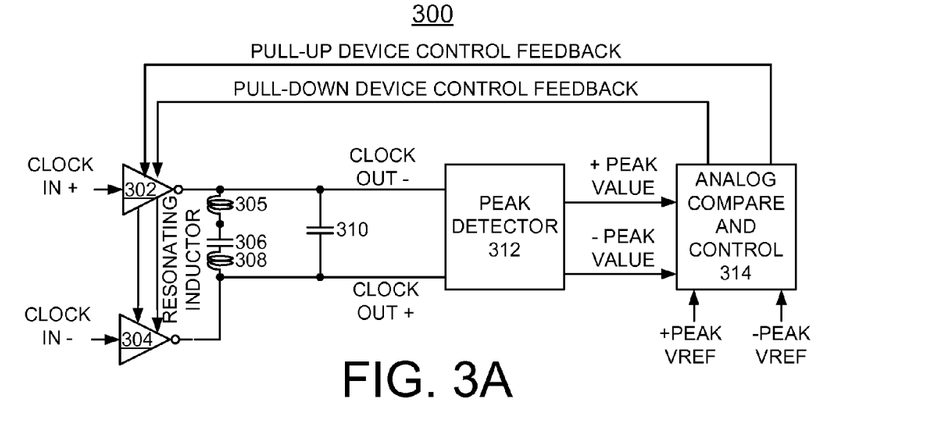
FIGS. 3A and 3B together provide a schematic and block diagram of an example inverting differential adaptive pulsed resonant clock driver for implementing adaptive control for optimization of pulsed resonant drivers in accordance with preferred embodiments.
Figure 3B:
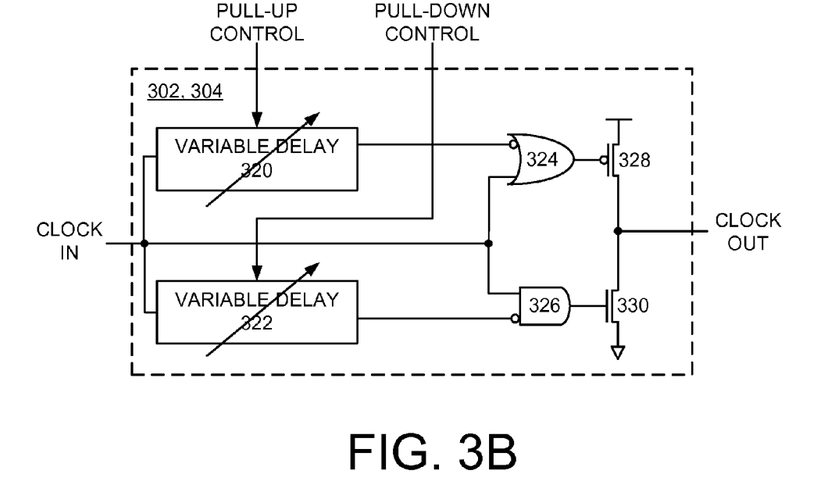

Referring to FIGS. 3A and 3B, there is shown an example inverting differential adaptive pulsed resonant clock driver generally designated by the reference character 300 for implementing adaptive control for optimization of pulsed resonant drivers in accordance with preferred embodiments.

Circuit 300 includes a clock input CLOCK IN+ applied to an inverting pulse driver 302 providing an inverted clock output CLOCK OUT−, a clock input CLOCK IN− applied to an inverting pulse driver 304 providing an inverted clock output CLOCK OUT+, a first resonating inductor 305, a large DC blocking capacitor C DC, 306, and a second resonating inductor 308 connected in series between the outputs of the inverting pulse drivers 302, 304. The large DC blocking capacitor C DC1, 306 connected in series with the inductors 305, 308 prevents the inductor from shorting the inverting pulse driver output to the lower power rail or ground at very low frequencies. An effective clock load capacitance 310 is composed of the circuit and wire loads. The resistive loss components (not shown) can be series resistance or parallel leakage resistance in almost any component. Common dominant loss components are series inductor R, wire series resistance, and capacitive load series resistance.

Circuit 300 includes a peak detector 312 connected between inverted clock outputs CLOCK OUT− and CLOCK OUT+ of the inverting pulsed drivers 302, 304, providing a detected positive peak value+PEAK VALUE and a detected negative peak value−PEAK VALUE applied to an analog compare and control 314. The peak detector 312 produces an analog value corresponding to the resonant voltage waveform peak positive or high level amplitude and the peak negative or low level amplitude.

The analog compare and control 314 compares the detected positive differential peak value+PEAK VALUE with the positive peak reference value+PEAK VREF and compares the detected negative differential peak value−PEAK VALUE with the negative peak reference value−PEAK VREF, to determine whether to increase or decrease the associated variable delay in the inverting pulse drivers 302, 304. The analog compare and control 314 generates and applies an identified pull-up device control feedback and a pull-down device control feedback applied to the inverting pulse drivers 302, 304 indicated at lines PULL-UP DEVICE CONTROL FEEDBACK, PULL-DOWN DEVICE CONTROL FEEDBACK. Note that the control to increase the differential positive peak amplitude will increase the inverting pulse driver 302 pull-up variable delay and increase the inverting pulse driver 304 pull-down variable delay. Likewise the control to increase the differential negative peak amplitude will increase the inverting pulse driver 302 pull-down variable delay and increase the inverting pulse driver 304 pull-up variable delay.

As shown in FIG. 3B, the inverting pulse drivers 302, 304 receives a respective clock input CLOCK IN applied to a variable delay 320 receiving a pull-up device control feedback PULL-UP and applied to a variable delay 322 receiving a pull-down device control feedback PULL-DOWN. The clock input CLOCK IN is applied to an input of a 2-input OR gate 324 with the output of the variable delay 320 applied to inverting input of the OR gate 324. The clock input CLOCK IN is applied to an input of a 2-input AND gate 326 with the output of the variable delay 322 applied to inverting input of the AND gate 326. The OR gate output provides an input to a pull-up P-channel field effect transistor (PFET) 328. The AND gate output provides an input to a pull-down N-channel field effect transistor (NFET) 330.

Figure 4A:
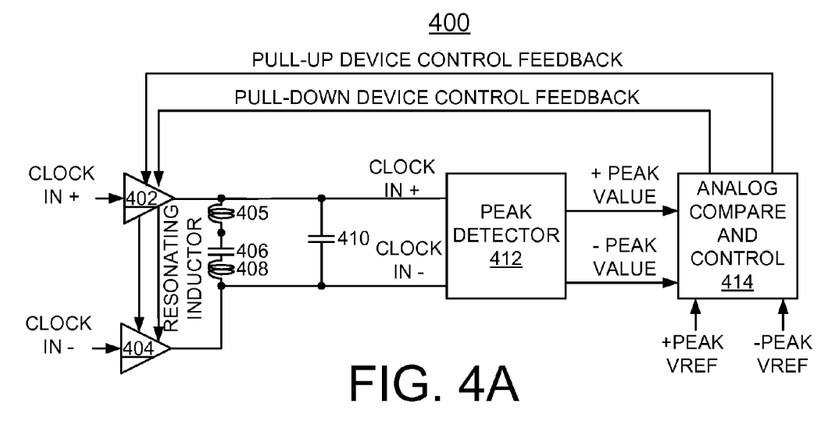
FIGS. 4A and 4B together provide a schematic and block diagram of an example non-inverting differential adaptive pulsed resonant clock driver for implementing adaptive control for optimization of pulsed resonant drivers for implementing adaptive control for optimization of pulsed resonant drivers in accordance with preferred embodiments.
Figure 4B:
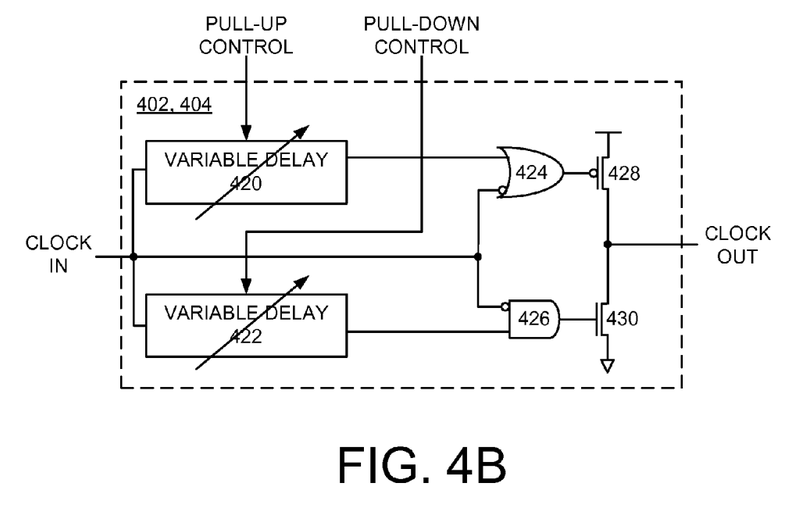

Referring to FIGS. 4A and 4B, there is shown an example non-inverting differential adaptive pulsed resonant clock driver generally designated by the reference character 400 for implementing adaptive control for optimization of pulsed resonant drivers in accordance with preferred embodiments.

Circuit 400 includes a clock input CLOCK IN+ applied to a non-inverting pulse driver 402 providing a non-inverting clock output CLOCK OUT+, a clock input CLOCK IN− applied to a non-inverting pulse driver 404 providing a non-inverting clock output CLOCK OUT−, a first resonating inductor 405, a large DC blocking capacitor C DC, 406, and a second resonating inductor 408 connected in series between the outputs of the inverting pulse drivers 402, 404. The large DC blocking capacitor C DC1, 406 connected in series with the inductors 405, 408 prevents the inductor from shorting the inverting pulse driver output to the lower power rail or ground at very low frequencies. An effective clock load capacitance 410 is composed of the circuit and wire loads. The resistive loss components (not shown) can be series resistance or parallel leakage resistance in almost any component. Common dominant loss components are series inductor R, wire series resistance, and capacitive load series resistance.

Circuit 400 includes a peak detector 412 connected between the non-inverted clock outputs CLOCK OUT− and CLOCK OUT+ of the non-inverting pulsed drivers 402, 404, providing a detected positive peak value+PEAK VALUE and a detected negative peak value−PEAK VALUE applied to an analog compare and control 414. The peak detector 412 produces an analog value corresponding to the resonant voltage waveform peak positive or high level amplitude and the peak negative or low level amplitude.

The analog compare and control 414 compares the detected positive differential peak value+PEAK VALUE with the positive peak reference value+PEAK VREF and compares the detected negative peak value−PEAK VALUE with the negative differential peak reference value−PEAK VREF, to determine whether to increase or decrease the associated variable delay in the non-inverting pulse drivers 402, 404. The analog compare and control 414 generates and applies an identified pull-up device control feedback and a pull-down device control feedback applied to the non-inverting pulse drivers 402, 404 indicated at lines PULL-UP DEVICE CONTROL FEEDBACK, PULL-DOWN DEVICE CONTROL FEEDBACK. Note that the control to increase the differential positive peak amplitude will increase the inverting pulse driver 402 pull-up variable delay and increase the inverting pulse driver 404 pull-down variable delay. Likewise the control to increase the differential negative peak amplitude will increase the inverting pulse driver 402 pull-down variable delay and increase the inverting pulse driver 404 pull-up variable delay.

As shown in FIG. 4B, the inverting pulse drivers 402, 404 receives a respective clock input CLOCK IN applied to a variable delay 420 receiving a pull-up device control feedback PULL-UP and applied to a variable delay 422 receiving a pull-down device control feedback PULL-DOWN. The clock input CLOCK IN is applied to an inverting input of a 2-input OR gate 424 with the output of the variable delay 420 applied to a second input of the OR gate 424. The clock input CLOCK IN is applied to an inverting input of a 2-input AND gate 426 with the output of the variable delay 422 applied to a second input of the AND gate 426. The OR gate output provides an input to a pull-up P-channel field effect transistor (PFET) 428. The AND gate output provides an input to a pull-down N-channel field effect transistor (NFET) 430.

In accordance with features of the preferred embodiments of the invention, in circuits 100A, 100B, 300, and 400, the lowest power dissipation is obtained with a minimum resonant clock signal swing; the fastest rise times with the biggest swing, including overshoots and undershoots, subject to breakdown voltage limitations. The lowest duty cycle distortion is usually between minimum and maximum amplitude. Whatever the optimization choice for the circuits 100A, 100B, 300, and 400 the adaptive feedback loop minimizes amplitude variations over process, voltage, temperature and load conditions.

Figure 5:
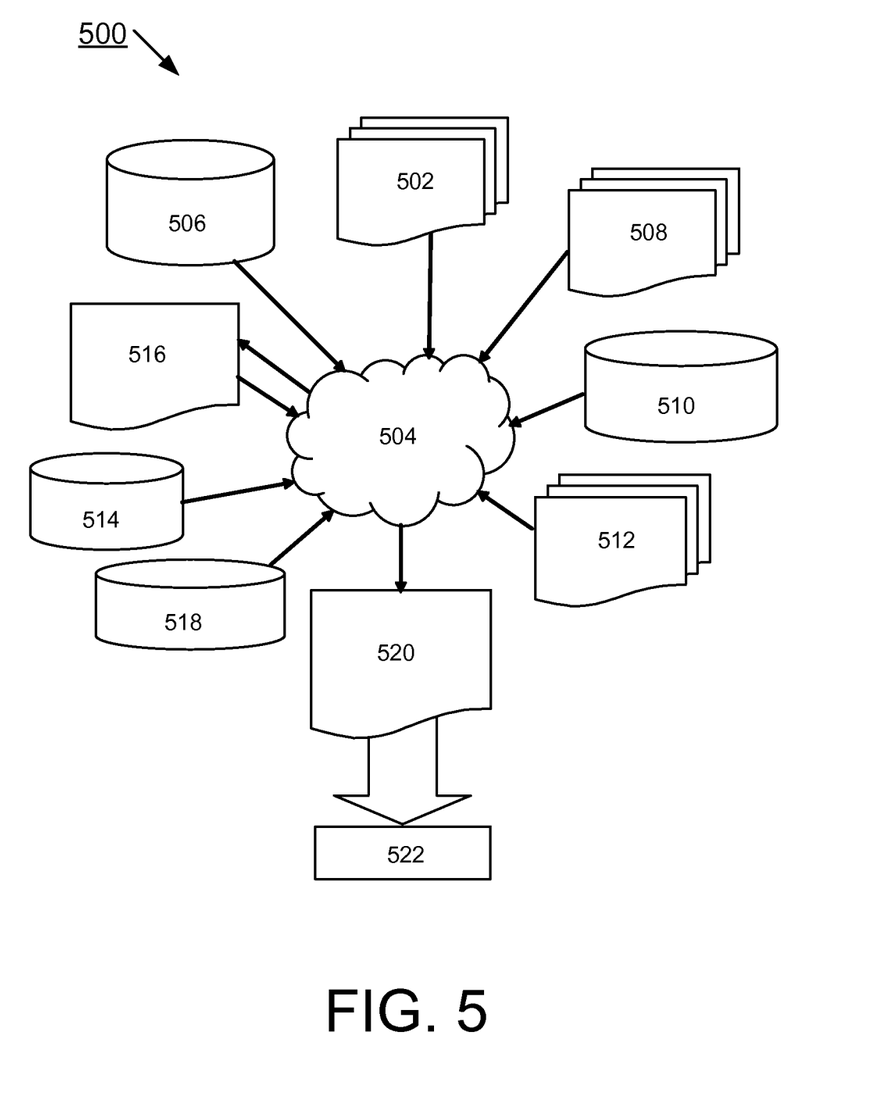
FIG. 5 is a flow diagram of a design process used in semiconductor design, manufacturing, and/or test.

FIG. 5 shows a block diagram of an example design flow 500. Design flow 500 may vary depending on the type of IC being designed. For example, a design flow 500 for building an application specific IC (ASIC) may differ from a design flow 500 for designing a standard component. Design structure 502 is preferably an input to a design process 504 and may come from an IP provider, a core developer, or other design company or may be generated by the operator of the design flow, or from other sources. Design structure 502 comprises circuits 100A, 100B, 300, and 400 in the form of schematics or HDL, a hardware-description language, for example, Verilog, VHDL, C, and the like. Design structure 502 may be contained on one or more machine readable medium. For example, design structure 502 may be a text file or a graphical representation of circuits 100A, 100B, 300, and 400. Design process 504 preferably synthesizes, or translates, circuits 100A, 100B, 300, and 400 into a netlist 506, where netlist 506 is, for example, a list of wires, transistors, logic gates, control circuits, I/O, models, etc. that describes the connections to other elements and circuits in an integrated circuit design and recorded on at least one of machine readable medium. This may be an iterative process in which netlist 506 is resynthesized one or more times depending on design specifications and parameters for the circuit.

Design process 504 may include using a variety of inputs; for example, inputs from library elements 508 which may house a set of commonly used elements, circuits, and devices, including models, layouts, and symbolic representations, for a given manufacturing technology, such as different technology nodes, 14 nm, 22 nm, 32 nm, 45 nm, 90 nm, and the like, design specifications 510, characterization data 512, verification data 514, design rules 516, and test data files 518, which may include test patterns and other testing information. Design process 504 may further include, for example, standard circuit design processes such as timing analysis, verification, design rule checking, place and route operations, and the like. One of ordinary skill in the art of integrated circuit design can appreciate the extent of possible electronic design automation tools and applications used in design process 504 without deviating from the scope and spirit of the invention. The design structure of the invention is not limited to any specific design flow.

Design process 504 preferably translates an embodiment of the invention as shown in FIGS. 1A, 1B, 1C, 3A, 3B, 4A, and 4B along with any additional integrated circuit design or data (if applicable), into a second design structure 520. Design structure 520 resides on a storage medium in a data format used for the exchange of layout data of integrated circuits, for example, information stored in a GDSII (GDS2), GL1, OASIS, or any other suitable format for storing such design structures. Design structure 520 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1A, 1B, 1C, 3A, 3B, 4A, and 4B. Design structure 520 may then proceed to a stage 522 where, for example, design structure 520 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing adaptive control for optimization of pulsed resonant drivers comprising:
    providing peak detectors for detecting a positive or up level reached by a resonant clock and a negative or down level reached by the resonant clock;
    comparing the detected levels to reference levels; and
    varying a turn off timing of a clock driver pull-up device and a clock driver pull-down device.

2. The method as recited in claim 1 wherein comparing the detected levels to reference levels includes providing an analog compare and control coupled to said peak detector, and applying the reference levels to said analog compare and control.

3. The method as recited in claim 2 further includes changing the reference level applied to said analog compare and control to control a resonant clock swing level relative to at least one voltage supply rail.

4. The method as recited in claim 2 includes providing a first variable delay coupled to the clock driver pull-up device and a second variable delay coupled to the clock driver pull-down device, and wherein said analog compare and control providing a pull-up control feedback to the first variable delay and a pull-down control feedback to the second variable delay.

5. The method as recited in claim 4 wherein the clock driver pull-up device comprises a P-channel field effect transistor (PFET) and the clock driver pull-down device comprises a N-channel field effect transistor (NFET) and includes providing an OR gate receiving a clock input and an output of said first variable delay and providing a gate input the clock driver pull-up PFET, and an AND gate receiving a clock input and an output of said second variable delay and providing a gate input to the clock driver pull-down NFET.

* * * * *